(12) United States Patent
Wieland et al.

(10) Patent No.: US 10,580,745 B1
(45) Date of Patent: Mar. 3, 2020

(54) WAFER LEVEL PACKAGING WITH INTEGRATED ANTENNA STRUCTURES

(71) Applicant: GLOBALFOUNDRIES Inc., Grand Cayman (KY)

(72) Inventors: Marcel Wieland, Radebeul (DE); Christian Goetze, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/118,791

(22) Filed: Aug. 31, 2018

(51) Int. Cl.
  *H01L 21/00* (2006.01)
  *H01L 23/66* (2006.01)
  *H01L 23/498* (2006.01)
  *H01L 23/00* (2006.01)

(52) U.S. Cl.
  CPC ............ *H01L 23/66* (2013.01); *H01L 23/498* (2013.01); *H01L 24/09* (2013.01); *H01L 2223/6677* (2013.01); *H01L 2224/02331* (2013.01); *H01L 2224/02372* (2013.01)

(58) Field of Classification Search
  CPC ........... H01L 21/486; H01L 2223/6677; H01L 21/56; H01L 2224/04105; H01L 2224/96; H01L 2924/181

USPC .......................................... 438/127; 257/787
See application file for complete search history.

(56) References Cited

U.S. PATENT DOCUMENTS

| 8,159,047 | B2* | 4/2012 | Huang | H01L 23/50 |
| | | | | 257/532 |
| 8,218,332 | B2* | 7/2012 | Droz | G06K 19/07745 |
| | | | | 257/778 |
| 8,952,521 | B2* | 2/2015 | Wojnowski | H01L 23/49816 |
| | | | | 257/675 |
| 10,312,112 | B2* | 6/2019 | Chuang | H01L 21/6835 |
| 2010/0059854 | A1* | 3/2010 | Lin | H01L 25/16 |
| | | | | 257/528 |
| 2018/0366347 | A1* | 12/2018 | Chuang | H01L 23/5389 |
| 2019/0122978 | A1* | 4/2019 | Tang | H01L 23/528 |
| 2019/0157224 | A1* | 5/2019 | Wan | H01L 24/20 |

* cited by examiner

*Primary Examiner* — S. V. Clark
(74) *Attorney, Agent, or Firm* — Amerson Law Firm, PLLC

(57) ABSTRACT

RF semiconductor chips may be packaged on wafer level on the basis of a two-step process for providing a package material, thereby providing very short electrical connections between antenna structures formed in the package material and the semiconductor chip. In some illustrative embodiments, the antenna structures may be provided above the semiconductor chip, which results in a very space-efficient overall configuration.

17 Claims, 4 Drawing Sheets

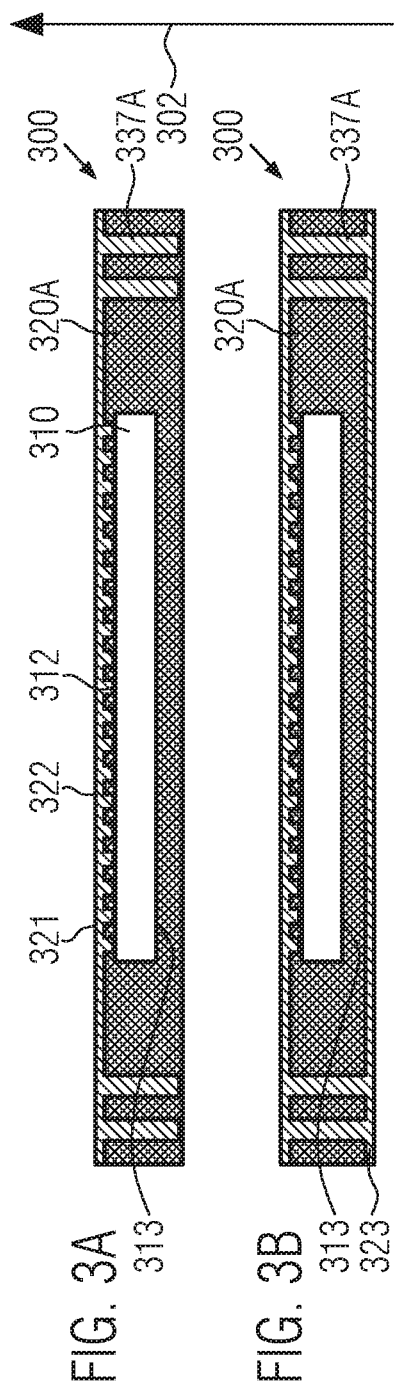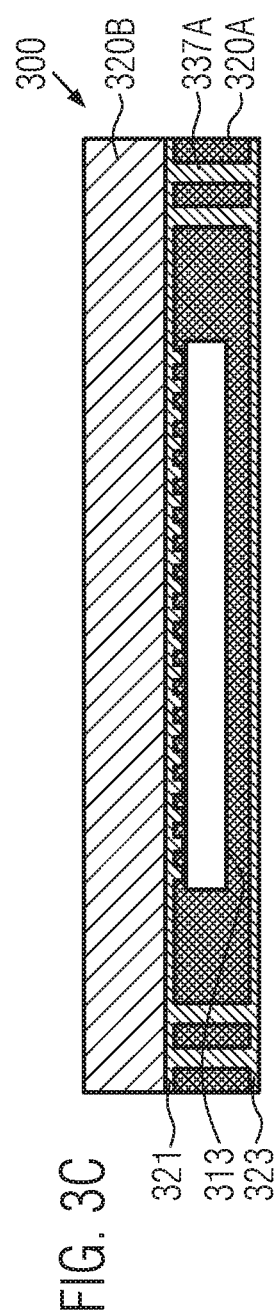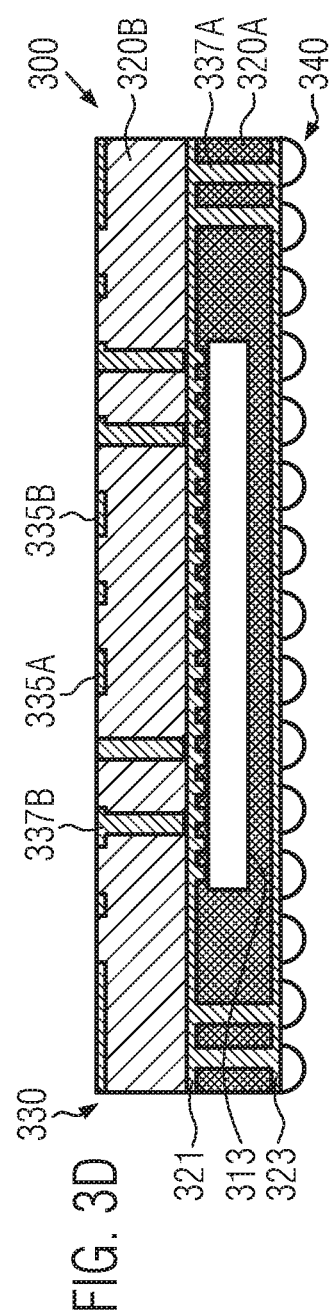

WAFER LEVEL PACKAGING WITH INTEGRATED ANTENNA STRUCTURES

BACKGROUND

1. Field of the Disclosure

Generally, the present disclosure relates to semiconductor devices including radio frequency (RF) components that have to be connected to respective antenna structures in order to establish wireless connection with the periphery of the semiconductor device.

2. Description of the Related Art

There is an ongoing trend in the field of semiconductor products to incorporate an increasing number of circuit elements into a single semiconductor die or chip, thereby offering the possibility of implementing entire systems on a single chip. Since generally the demand for wireless connectivity of electronic devices is increasing, there is also a continuously growing demand for implementing respective wireless connectivity in individual semiconductor chips, thereby significantly increasing flexibility and the field of applications for electronic components. For example, for low-end sensor devices, wireless signal transmission provides superior flexibility in establishing complex systems that may operate on the basis of information from sensor devices and the like. On the other hand, even highly complex systems on a single chip may have to be equipped with sophisticated wireless connectivity for communicating with other components, such as sensors, supervising control equipment and the like.

Upon implementing wireless connectivity at chip level, not only respective RF components, such as amplifiers, local oscillators, phase locked loop components and the like, have to be provided in the semiconductor chip, but also a respective antenna structure has to be positioned in the vicinity of these RF components in order to obtain appropriate performance with respect to power loss, robustness against interference and the like. Upon further reducing the wavelength and thus increasing the frequency of the respective communication channels that are typically used for wireless connectivity, in recent developments, frequencies ranging from approximately 20-110 GHz have to handled, thereby imposing significant burden on the overall design of the analog radio frequency portion of a respective electronic component. For example, with reduced wavelengths in the millimeter range, the interface between the respective antenna structures and the actual electronic components, such as the final radio frequency amplifier for a transmitter or the input amplifier for a receiver, is a highly critical device portion, since, for instance, any excess length of respective feed lines may result in significant signal loss, interference and the like. Therefore, great efforts are being made in this field of technology so as to provide highly efficient intermediate structures that electrically connect the antenna structures and the actual electronic components in the semiconductor chip. For example, dedicated substrates have been developed on the basis of specific materials with an appropriate contact structure so as to efficiently connect to the semiconductor chip and, thus, provide efficient overall performance of the completed electronic device that comprises the semiconductor chip, a respective package, a specifically designed substrate having formed therein antenna structures and the like. In other recent approaches, the antenna structures may be provided in the semiconductor chip, which, however, may result in significant additional chip area, thereby contributing to significantly higher overall manufacturing costs.

Generally, there is a tendency in the field of semiconductor technology according to which the packaging of the semiconductor chips may be accomplished on wafer level, that is, the semiconductor die may be packaged prior to actually separating the wafer into individual semiconductor chips, thereby achieving a highly cost-efficient packaging process.

Since packaging on wafer level is a very promising approach for manufacturing semiconductor devices due to performing respective process steps for wafers instead of for individual dies and thereby reducing yield loss at a final state of the overall manufacturing flow, the present disclosure generally relates to semiconductor devices and manufacturing techniques in which antenna structures may be incorporated, while avoiding or at least reducing the effects of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Basically, the present disclosure considers the concept of wafer level packaging for radio frequency (RF) semiconductor devices by applying molding techniques based on appropriate materials, which have been identified as superior materials for RF applications. Moreover, antenna structures may be incorporated into the respective dielectric material, for example, the mold material, in combination with any other appropriate connecting structures, such as metallization layers for re-distributing the electrical connections of the semiconductor chip to a chip external level of less critical lateral dimensions that allows a connection to the periphery of the semiconductor chip, such as a further carrier substrate, a printed circuit board and the like. Typically, such distributing connection structures in the form of metal lines, metal pads and contact vias or elements may be referred to as redistribution layer and represent an interface between the typically densely packed contact pads of the final metal layer of the semiconductor chip and external components, such as substrate packages, printed circuit boards and the like. It has been recognized that basically the packaging technique based on dielectric materials enclosing the semiconductor chip that are applied, for instance, on the basis of a molding process, may be advantageously used for incorporating the respective antenna structures in a highly space-efficient manner, thereby achieving extremely short electrical connections between the semiconductor chip and the antenna structures, while at the same time the superior characteristics of the dielectric material may contribute to superior performance of the packaged RF semiconductor chip. For example, in some illustrative embodiments, in addition to forming a redistribution layer on the basis of a first molding process, a further molding process may be used in order to incorporate the required antenna structures and respective connections, thereby obtaining a wafer level packaging process, wherein the antenna structures are provided within the package material with a very short conductive path between the antenna structures and the actual semiconductor chip.

According to one illustrative embodiment disclosed herein, a method includes forming a first redistribution layer above a first surface of a semiconductor chip, wherein the first redistribution layer includes at least one antenna ground plate. The method further includes attaching the semiconductor chip to the first redistribution layer. Moreover, a first dielectric material is formed so as to surround the semiconductor chip and mechanically connect the semiconductor chip to the first redistribution layer. The method further includes forming a second redistribution layer so as to connect to a second surface of the semiconductor chip, wherein the second surface is opposed to the first surface. Additionally, the method includes forming a metallization structure in a second dielectric material, wherein the metallization structure includes one or more antenna structures and a connection structure that connects the one or more antenna structures to the first redistribution layer.

According to a further illustrative embodiment disclosed herein, a radio frequency (RF) semiconductor device includes a semiconductor chip that includes at least one radio frequency component, wherein the semiconductor chip has a first surface and an opposed second surface. The RF semiconductor device further includes a dielectric package material that encloses the semiconductor chip. Moreover, a first redistribution layer is formed above the first surface of the semiconductor chip, wherein the first redistribution layer includes at least one antenna ground plate that is laterally positioned so as to be at least partially within an outline of the semiconductor chip when viewed along a height direction. The semiconductor device further includes a second redistribution layer formed below the second surface of the semiconductor chip. Additionally, the radio frequency semiconductor device includes a metallization structure formed above the first surface and spaced apart from the first redistribution layer along the height direction and includes one or more antenna structures, wherein at least one of the one or more antenna structures is within the outline of the semiconductor chip when viewed along the height direction.

According to still a further illustrative embodiment disclosed herein, a radio frequency (RF) semiconductor device includes a semiconductor chip including at least one RF component, wherein the semiconductor chip has a first surface and an opposed second surface. The semiconductor device further includes a dielectric package material enclosing the semiconductor chip. Furthermore, a first redistribution layer is formed above the first surface of the semiconductor chip, wherein the first redistribution layer includes at least an antenna ground plate that is laterally positioned so as to be at least partially within an outline of the semiconductor chip when viewed along a height direction. Moreover, a second redistribution layer is formed below the second surface of the semiconductor chip. Finally, a metallization structure is formed above the first surface and the first redistribution layer along the height direction, wherein the metallization structure includes a plurality of antenna structures, each of which is at least partially within the outline of the semiconductor chip when viewed along the height direction.

BRIEF DESCRIPTION OF THE DRAWINGS

The disclosure may be understood by reference to the following description taken in conjunction with the accompanying drawings, in which like reference numerals identify like elements, and in which:

FIGS. 3A-3D schematically illustrate cross-sectional views of a semiconductor device during various manufacturing stages for incorporating antenna structures into the package material provided on the basis of a two-step molding process with contact elements being formed in an upper portion of the package material by, for instance, laser drilling, according to illustrative embodiments.

Figure 1:
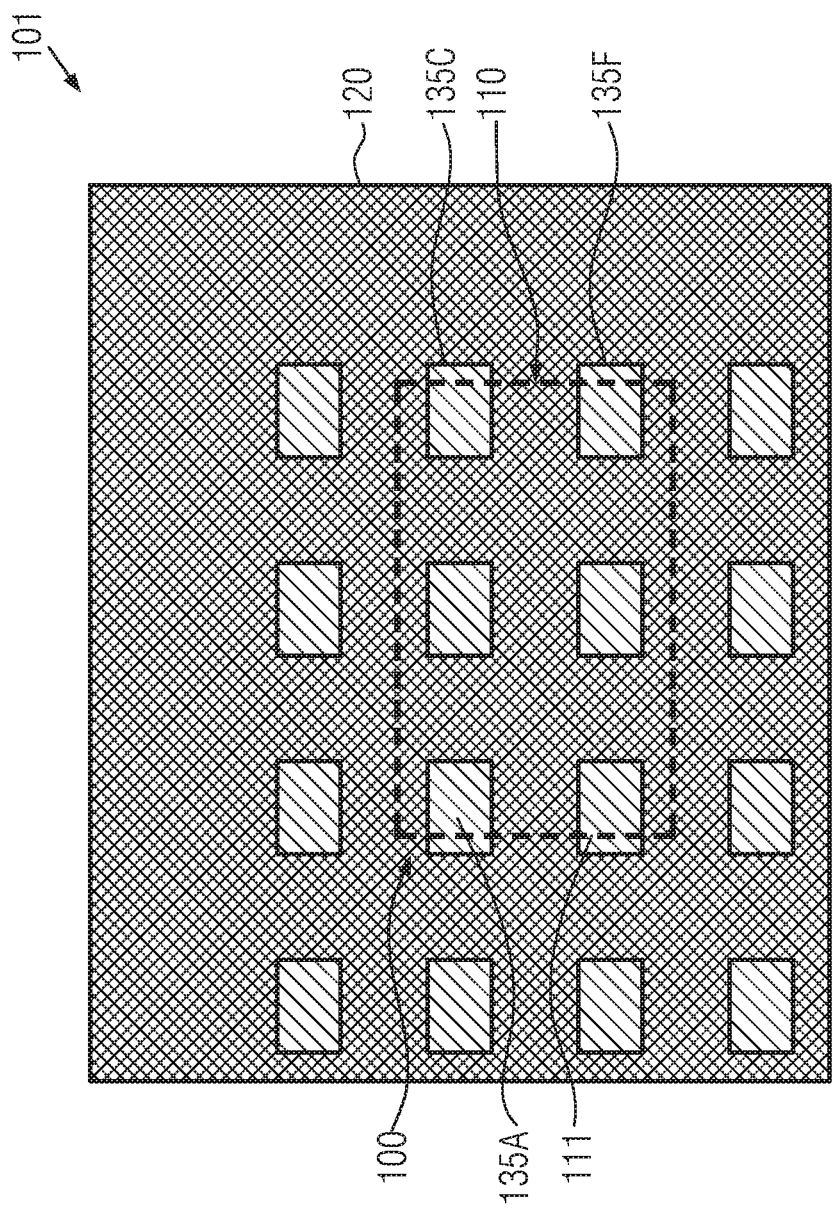
FIG. 1 schematically illustrates a top view of a semiconductor chip packaged at wafer level with a plurality of antenna structures incorporated in the package material within the outline of the semiconductor chip, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is based on the concept that antenna structures may efficiently be positioned close to the actual semiconductor chip by incorporating the respective antenna structures, i.e., antenna patches, and a respective reflector or ground plate into the package material, which may be used for enclosing the semiconductor chip and a respective redistribution system at wafer level. To this end, the package material may be provided in a two-step sequence, wherein, in the first step, the required redistribution layer in combination with a reflector or ground plate of the entire antenna system may be provided, while the remaining package material may be formed in a second step, wherein, prior to or after forming the second portion of the package material, at least contact elements of a metallization structure for electrically connecting the antenna structures may be formed.

In some illustrative embodiments, the antenna structures, i.e., antenna patches, the ground plate for the antenna system and the semiconductor chip, may be provided as a stacked configuration, wherein at least some of these components may laterally overlap when viewed from a height direction of the respective component stack. That is, upon viewing the packaged semiconductor device in top view, i.e., along the respective height direction, at least one of the one or more antenna structures may be positioned laterally within the outline of the semiconductor chip, thereby contributing to a highly space-efficient configuration that allows the packaging at wafer level and also ensures short electrical connections between the antenna structures and the semiconductor chip.

Forming the chip package at wafer level on the basis of a two-step process, for instance, by a two-step molding process, provides the possibility of appropriately controlling dimensions, in particular a thickness, of the respective cavity that accommodates the semiconductor chip. Moreover, the antenna structures or antenna patches may be positioned on top of the package in a highly precise manner, wherein also planarity of the respective antenna structures may be controlled in a very precise process, since the two-step process enables intermediate planarization steps so as to reduce inter-level height deviations of the antenna structures as well as intra-level deviations of the antenna structures with respect to the ground plate. In this manner, a high-performance antenna system may be established with superior directionality due to the highly planar configuration of the antenna structures and the ground plate(s). In particular, when providing a plurality of individually controllable antenna structures, high precision control of the directionality of the emitted radiation may be obtained, since efficiency of any such control strategies strongly depends on the planarity of the individual antenna structures. Furthermore, by incorporating the antenna structures into the package material, the corresponding superior material properties may be taken advantage of, while additional flexibility is obtained by using at least two separate process steps for applying the package material, since a thickness thereof, i.e., a distance between antenna structures and the ground plate(s), may be precisely adjusted depending on the material characteristics, the wavelength of the radiation(s) to be emitted and the like.

FIG. 1 schematically illustrates a top view of a semiconductor device 100 in a packaged state, wherein the semiconductor device 100 is still part of a substrate or wafer 101 that may include a plurality of semiconductor devices of the same type (not shown). That is, the packaged semiconductor device 100 may still have to be diced, so as to be connected to a further package substrate (not shown) or printed circuit board (not shown).

In this stage, the packaged semiconductor device 100 may comprise a semiconductor chip 110, which may be understood as any component having formed therein respective electronic components, such as transistors, resistors, capacitors, inductors and the like, that form, depending on the overall circuit design of the semiconductor chip 110, at least one circuit that needs to be connected to an antenna system. Depending on the complexity of the semiconductor chip 110, even an entire system, i.e., a plurality of functional circuit portions commonly representing the functionality of a specific electronic system, may be incorporated in the semiconductor chip 110, wherein, as discussed above, in particular radio frequency (RF) components may be incorporated so as to impart wireless connectivity to the packaged semiconductor device 100. Consequently, the semiconductor chip 110 may include fast switching transistor elements enabling signal processing for signals in a frequency range of approximately 20-110 GHz, depending on the requirements for the wireless communication of the semiconductor device 100 with any peripheral components.

Furthermore, the semiconductor device 100 may include a package material 120, which may be provided in the form of any appropriate dielectric material, such as epoxy resin-based materials and the like, as are typically used in packaging semiconductor chips at wafer level. It should be appreciated that, in some illustrative embodiments, the package material 120 may have a substantially continuous material composition irrespective of the fact that the package material 120 may be applied in at least two separate process steps, while, in other cases, the package material 120 may have different material composition in the lateral directions, i.e., in FIG. 1, the horizontal and vertical directions, and/or in a height direction, i.e., in FIG. 1, a direction perpendicular to the drawing plane of FIG. 1.

The package material 120 may have incorporated therein at or near a respective surface thereof one or more antenna structures or patches 135A . . . 135F, which may be formed of any appropriate conductive material, such as copper, copper alloys, aluminum, silver, gold and the like. Although the present disclosure may include, in some illustrative embodiments, the possibility of a single antenna patch or structure 135, in other illustrative embodiments, two or more antenna structures 135A . . . 135F may be provided with a lateral position such that at least one of the plurality of antenna structures 135A . . . 135F is within an outline 111 of the semiconductor chip 110. That is, at least one of the antenna structures 135A . . . 135F is within the outline 111, while, in a further illustrative embodiment, as for instance shown in FIG. 1, any one of the plurality of antenna structures 135A . . . 135F is at least partially within the outline 111 and thus overlaps with the chip area delineated by the outline 111, when viewed in the height direction. Moreover, it should be appreciated that although six antenna structures 135A . . . 135F are shown in FIG. 1, any other appropriate number of antenna structures may be implemented, depending on the overall device requirements. Furthermore, the specific lateral shape of the antenna structures 135A . . . 135F and the size thereof may also be adjusted in accordance with overall requirements. As will be evident from the following description, the present disclosure provides techniques, in which a high degree of flexibility in designing and positioning respective antenna structures may be achieved.

Respective manufacturing techniques for forming the packaged semiconductor device 100 as illustrated in FIG. 1 will be discussed later on in the context of FIGS. 3A-3D and 4A-4E.

Figure 2A:
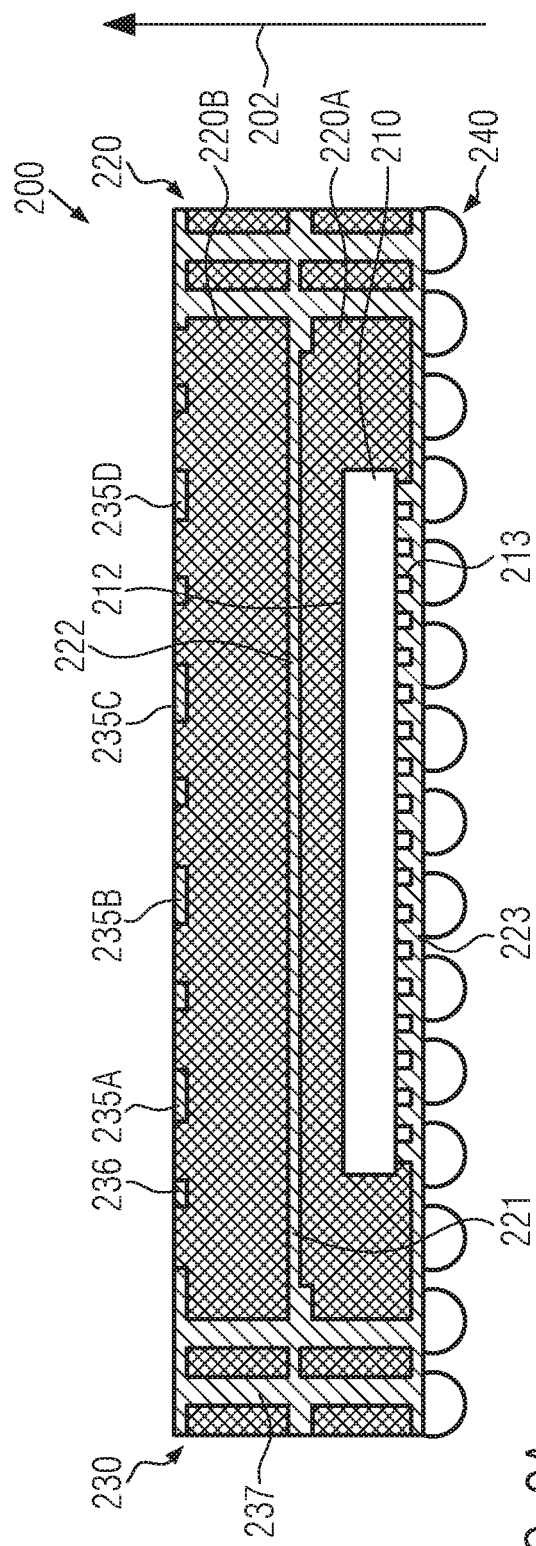
FIGS. 2A and 2B schematically illustrate cross-sectional views of semiconductor devices including antenna structures in the package material, i.e., in the mold material, wherein the semiconductor chip is provided "face down" (FIG. 2A) for providing a highly efficient routing of chip internal contact pads to a contact structure for a package substrate, and with the semiconductor chip positioned "face up" (FIG. 2B) for providing very short electrical connections between the semiconductor chip and the antenna structures formed in the package material, according to illustrative embodiments.

FIG. 2A schematically illustrates a cross-sectional view of a semiconductor device 200, which may have basically the same configuration as the semiconductor device 100 as illustrated in FIG. 1, except for the size and number of antenna structures provided in a respective package material. As illustrated, the semiconductor device 200 may include a semiconductor chip 210 having a first surface 212 and an opposed second surface 213. With respect to the overall configuration of the semiconductor chip 210, it is also referred to the semiconductor chip 110 previously discussed in the context of FIG. 1.

Furthermore, in the embodiment shown, the second surface 213 may represent a "functional" or "active" surface that may include a plurality of contact pads (not shown), which may represent respective "endpoints" of a metallization system (not shown) providing electrical connection to the electronic components in the semiconductor chip 210. The semiconductor chip 210 may be enclosed by a package material 220, such as a plastic material based on an epoxy resin, polymer materials and the like, in order to impart mechanical strength, electrical integrity and the like to the semiconductor chip 210. As shown, the package material 220 may include a first portion or first dielectric material 220A, which may enclose the semiconductor chip 210 and may thus be in contact therewith, while a second portion or a second dielectric material 220B may be formed "above" the first portion 220A. In some illustrative embodiments, the first and second portions 220A, 220B may represent the same package material and may thus have substantially identical characteristics with respect to radio frequency behavior, mechanical robustness, thermal behavior and the like. Consequently, in such cases the "response" of the package material 220 as a whole to any thermal, mechanical, electrical and other stimuli may be efficiently predictable. It should be appreciated that the material characteristics of the package material 220 may readily be adapted by preparing any type of compound material, for instance, by mixing a respective base material, such as an epoxy resin or any other polymer material, with other components, such as inorganic components in the form of silicon dioxide and the like.

As is evident, in some illustrative embodiments, the semiconductor chip 210, the first portion of the package material 220A and the second portion 220B form a stacked configuration, wherein the stacking direction is also referred to as a height direction, indicated by 202, i.e., the vertical direction in FIG. 2A.

A first redistribution layer 221 may be formed in the package material 220 "above" the first surface 212 of the semiconductor chip 210.

It should generally be appreciated that any reference with respect to a relative position along the height direction 202 is to be understood as being referenced to the first surface 212 of the semiconductor chip 210. For example, in this respect, the second surface 213 is positioned "below" the first surface 212.

The first redistribution layer 221 may represent a layer of conductive material having an appropriate pattern formed therein so as to provide contact areas, if required, wherein at least one or more ground layers or ground plate(s) 222 may be provided so as to laterally overlap with the semiconductor chip 210. The ground plate(s) 222 may be understood as a two-dimensional conductive region, which may be formed so as to oppose respective antenna structures or patches 235A, 235B, 235C and 235D that form a part of a metallization structure 230. That is, the metallization structure 230 is formed within the package material 220 and in particular within the second portion 220B. The metallization structure 230 may additionally include respective metal lines or regions 236, which may be used for connecting the respective antenna structures 235A-235D with respective contact elements 237, which in turn provide connection to a second redistribution layer 223 formed below the second surface 213 and providing electrical connection to the respective chip internal contact pads (not shown) formed in or near the second surface 213. The metal lines or regions 236 and the contact elements may be referred to as a connection structure of the metallization structure 230. Consequently, the antenna structures 235A-235D may be electrically connected to the chip internal components of the semiconductor chip 210 via the respective metal lines 236 and the contact elements 237 of the metallization structure and the second redistribution layer 223, thereby enabling a respective individual control of the antenna structures 235A-235D.

Moreover, the second redistribution layer 223 is appropriately structured so as to provide electrical connection to a contact structure 240, which may include solder balls, metal columns and the like, in order to provide connectivity to a further carrier substrate (not shown) or a printed circuit board (not shown). Consequently, in the embodiment shown in FIG. 2A, the semiconductor chip 210 is positioned "face down," which means that electrical contact with the periphery of the semiconductor chip 210 is established via the second surface 213 and the second redistribution layer 223, which also provides electrical connection to the first redistribution layer 221, for instance to the ground plate 222, and to the metallization structure 230 and thus to the antenna structures 235A-235D. In this configuration, short connections are provided from the chip 210 to the contact structure 240, which may be advantageous in the context of fast operating electronic components requiring fast I/O (input/output) capabilities. On the other hand, the antenna structures 235A-235D may still be provided in a highly space-efficient manner, since at least some or all of the antenna structures 235A-235D overlap with and/or are within the outline of the semiconductor chip 210 with respect to the height direction 202, as is also discussed in the context of the semiconductor device 100 of FIG. 1.

Figure 2B:
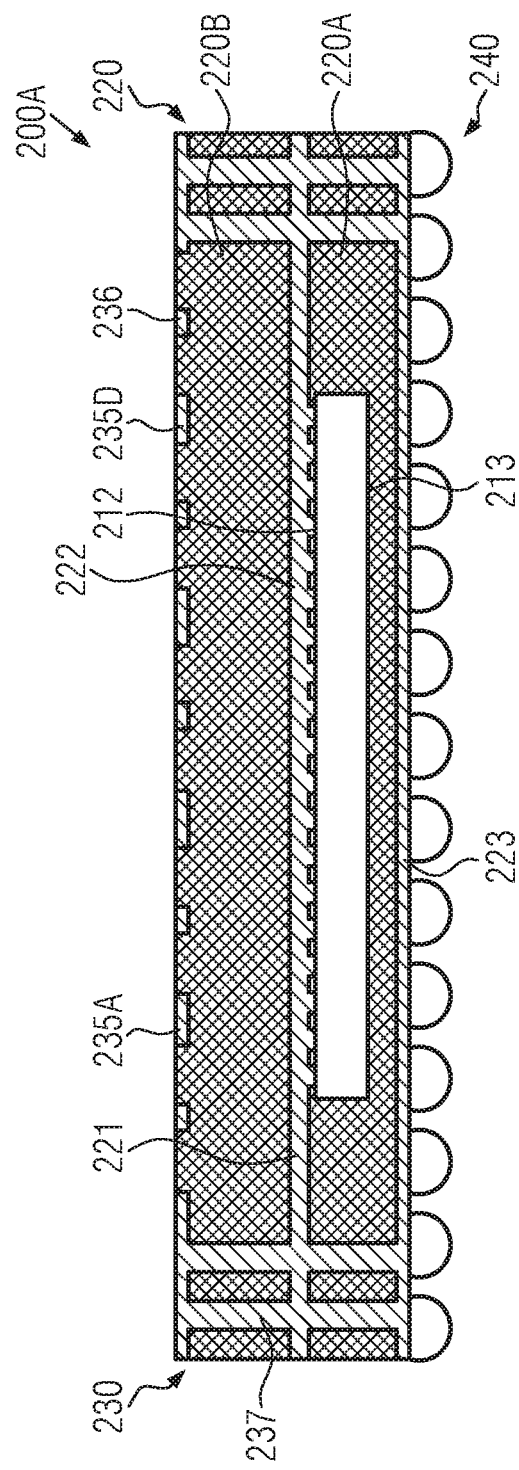

FIG. 2B schematically illustrates a semiconductor device 200A, which may have basically the same configuration as the semiconductor device 200 of FIG. 2A, except for the orientation of the semiconductor chip 210 along the height direction 202. Consequently, respective components will be denoted by the same reference numerals and any redundant explanations of any such components will be omitted.

Thus, the semiconductor device 200A includes the package material 220 with the first and second portions 220A, 220B, with the first redistribution layer 221 formed above a first surface 212 of the semiconductor chip 210, which, contrary to the semiconductor device 200 as shown in FIG. 2A, has respective chip internal contact pads (not shown) formed in and near the surface 212. Consequently, the first redistribution layer 221, including one or more ground plates 222, may further be structured so as to appropriately connect to the first surface 212. On the other hand, the second redistribution layer 223 formed below the second surface 213 of the semiconductor chip 210 may connect to the contact structure 240 by means of appropriately structured and routed conductive lines and may connect to the metallization structure 230 by means of the respective contact elements 237. The contact elements 237, on the other hand, also provide electrical connection to the antenna structures 235A-235D, wherein an even reduced length between respective components in the semiconductor chip 210 and the antenna structures 235A-235D may be established, thereby even further reducing any negative effects that may be caused by feed lines for the antenna structures 235A-235D.

With reference to FIGS. 3A-3D and FIGS. 4A-4E, respective manufacturing techniques and strategies are described, which may be used for forming a packaged semiconductor device, such as the devices 100, 200, 200A previously discussed in the context of FIGS. 1, 2A and 2B.

FIG. 3A schematically illustrates a cross-sectional view of a semiconductor device 300 in a manufacturing stage in which a semiconductor chip 310 is embedded in a first portion 320A of a package material. With respect to the characteristics of the portion 320A, it may be referred to the semiconductor devices 100, 200 and 200A. Furthermore, a first redistribution layer 321 is formed in or on the first portion 320A and has an appropriate structure so as to connect to a first surface 312 of the semiconductor chip 310. As previously discussed in the context of FIG. 2B, the semiconductor chip 310 may have a "face up" configuration, so that respective electrical connections from the semiconductor chip 310 to the periphery and in particular into the respective package material may be accomplished by means of the first redistribution layer 321 that connects to the first surface 312. Furthermore, the first redistribution layer 321 may include at least one ground plate 322 overlapping with and/or being laterally contained within the outline of the semiconductor chip 310 when viewed along a height direction 302. Moreover, respective vias 337A, which may be understood as a first part of respective contact elements still to be formed, may be provided in the first portion 320A so as to connect to the first redistribution layer 321.

The semiconductor device 300 as illustrated in FIG. 3A may be formed in accordance with the following process strategies. In some approaches, the redistribution layer 321 may be formed on the basis of any appropriate sacrificial material (not shown), such as a class material and the like, wherein known patterning techniques may be applied to as to provide respective trenches and openings, which may be filled with an appropriate conductive material, such as copper, a copper alloy, silver, aluminum and the like. In this respect, also the vias 337A may be formed, for instance, by forming respective openings and filling the same on the basis of appropriate deposition recipes, such as a plating technique and the like. After having established the first redistribution layer 321 and the vias 337A, the semiconductor chip 310 may be attached to the first redistribution layer 321 by any appropriate technique, for instance, by using an adhesion tape and the like. It should be appreciated that the attaching of the semiconductor chip 310 is performed on a wafer level, that is, a respective wafer including a plurality of semiconductor chips is attached to a corresponding structure including a plurality of first redistribution layers 321.

Thereafter, an appropriate dielectric material, i.e., the portion 320A of the package material, may be formed, for instance by a molding process using appropriate precursor materials, such as epoxy resin, polymer materials and the like, wherein appropriate material characteristics may be adjusted by introducing further materials, such as inorganic components in the form of silicon dioxide and the like. Upon forming the portion 320A, for instance, by a molding process, such as a type of injection molding, the semiconductor chip 310 may be reliably embedded into the material 320A, while also respective cavities may be filled within the material 320A, for instance, respective "spaces" between conductive lines and regions of the first redistribution layer 321 and the vias 337A.

FIG. 3B schematically illustrates the semiconductor device 300 in a further advanced manufacturing stage. That is, after forming the portion 320A, for instance, by means of a first molding process, the surface of the material 320A in the vicinity of the second surface 313 may be ground and, thus, planarized and may be patterned, if required, for instance by lithography, so as to form a second redistribution layer 323 on the basis of any appropriate conductive material. In this manner, a connection between the first redistribution layer 321 and the second redistribution layer 323 may be established by means of the vias 337A. A respective electrical connection may be required for providing an appropriate contact structure below the surface 313 for connecting to external components.

FIG. 3C schematically illustrates the semiconductor device 300 in a further advanced manufacturing stage, in which a second portion 320B of a package material may be formed on and above the first redistribution layer 321. To this end, a further molding process may be performed on the basis of any appropriate precursor material. As discussed above, in some illustrative embodiments, the first and second portions 320A, 320B may have substantially identical material characteristics, thereby providing a cost-efficient manufacturing process on the basis of a material system having well-controllable and predictable material characteristics.

In some illustrative embodiments, the thermal and mechanical response of the package material 320A, 320B at certain operating conditions of the device 300 may be determined in advance or during the production process and a correlation may be obtained between one or more material parameters, such as material composition, material thickness and the like, so as to enable a prediction of mechanical stress conditions in the package material 320A, 320B for given operating conditions. Furthermore, a correlation may be determined between a thickness of the first and/or second redistribution layers 321, 323 and a respective stress condition in the package material 320A, 320B, thereby providing an efficient technique for controlling stress in the package material 320A, 320B during operation of the semiconductor device 300 in various operating conditions. That is, upon determining a respective correlation, the stress behavior of the package material 320A, 320B may be controlled by adjusting the thickness of one or both of the redistribution layers 321 and 323. Since the package material 320A, 320B may be provided in a two-step deposition process, such as a molding process sequence, the final thickness and planarity for a given material composition may be adjusted in a very precise manner, thereby contributing to superior performance of the completed semiconductor device 300.

After providing the second portion 320B, a patterning process may be applied, for instance, for forming openings through the material 320B on the basis of laser drilling techniques and the like in order to establish a connection to the vias 337A. Respective openings may then be filled with an appropriate conductive material, such as copper, copper alloy and the like, which may be accomplished on the basis of plating techniques and the like.

FIG. 3D schematically illustrates the semiconductor device 300 in a further advanced manufacturing stage. As illustrated, a metallization structure 330 may be formed in the second portion 320B including respective contact elements 337B, which may be formed by laser drilling and plating, as discussed above, while respective antenna structures 335A, 335B may be provided at a top surface of the second portion 320B. The antenna structures 335A, 335B and the respective further metal lines and regions may be formed by appropriately patterning the second portion 320B, for instance, by lithography and the like, followed by a deposition process for depositing a conductive material and a removal of non-required portions thereof. To this end, any known process strategies may be applied.

Thereafter, the entire ensemble including the semiconductor device 300 may be processed so as to receive a contact structure 340, which may be accomplished by known process strategies for providing a dielectric material, if required, and forming appropriate contact elements in the form of solder balls, metal columns and the like, as is known in flip-chip contact regimes. Consequently, the contact structure 340 is electrically connected to the semiconductor chip 310 by means of the second redistribution layer 323, the vias 337A and the first redistribution layer 321, which also includes the ground plate(s) 322 (see FIG. 3A).

Figure 4A:
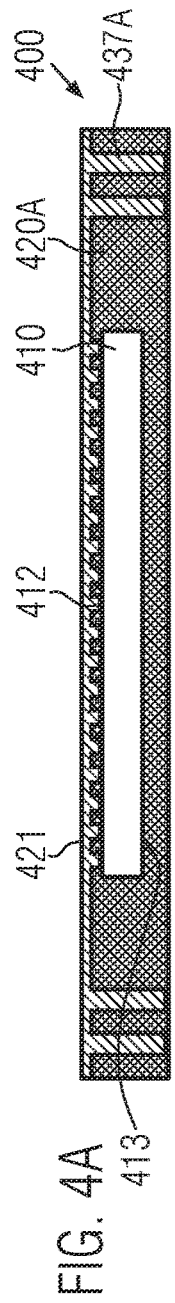
FIGS. 4A-4E schematically illustrate cross-sectional views of the semiconductor device during various manufacturing stages in performing a two-step molding process, wherein contact elements are formed by patterning the second level of the package material by lithography, according to still further illustrative embodiments.

FIG. 4A schematically illustrates a cross-sectional view of a semiconductor device 400 during various manufacturing stages in forming a packaged semiconductor device, wherein the package material includes respective antenna structures. It should be appreciated that any components of the semiconductor device 400 that are similar or identical to previously described components are denoted by the same reference signs except for a leading digit "4" instead of a "3" or "2" or "1", and a corresponding redundant explanation of any such components may be omitted.

In FIG. 4A, the semiconductor device 400 has basically the same configuration as the semiconductor device 300 in FIG. 3A and thus includes the semiconductor chip 410 connected with its first surface 412 to the first redistribution 421 that is formed in and above the first portion 420A of a package material. The device 400 as shown in FIG. 4A may be formed in accordance with the process strategy as previously discussed in the context of FIG. 3A.

Figure 4B:
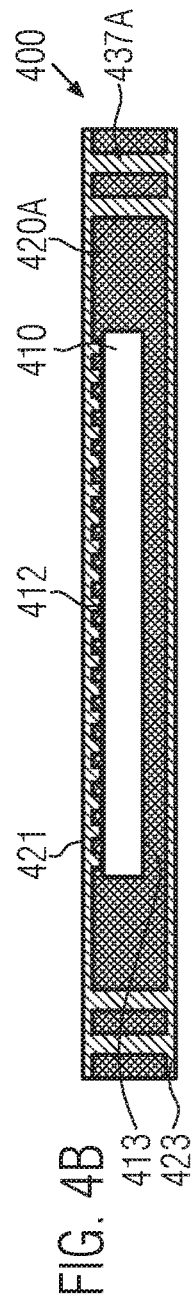

FIG. 4B schematically illustrates the semiconductor device 400 in a further advanced manufacturing stage, in which the second redistribution layer 423 may be formed below the second surface 413 of the semiconductor chip 410 and which may be connected to the first redistribution layer 421 by means of the vias 437A. Regarding any process strategies for forming the configuration as shown in FIG. 4B, it may be referred to the semiconductor device 300.

Figure 4C:
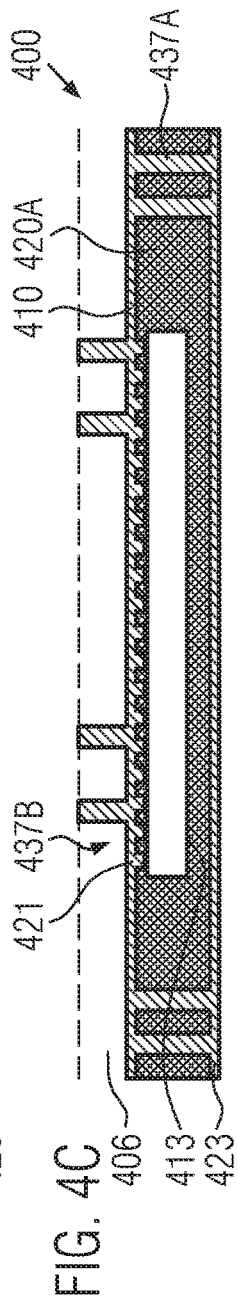

FIG. 4C schematically illustrates the semiconductor device 400, wherein contact elements 437B may be formed on the first redistribution layer 421 with appropriate height and dimensions so as to electrically connect antenna structures still to be formed to the first redistribution layer 421. The contact elements 437B may be formed on the basis of a sacrificial material 406, which may be provided in the form of a thick film resist having a thickness that corresponds, basically, to a desired height of the contact elements 437B. The sacrificial material 406 may be patterned on the basis of a lithography process, wherein the material 406 itself may be a radiation-sensitive material or may be patterned on the basis of a radiation-sensitive resist material. Consequently, by applying a lithography process for patterning at least the contact elements 437B, the dimensions, positions and, in particular, the shapes thereof along the height direction may be adjusted in a very precise manner. That is, respective openings formed in the sacrificial material 406 may receive any appropriate shape, for instance, very steep sidewalls may be obtained during the patterning process by applying well-established etch techniques having an anisotropic etch behavior. Furthermore, the sidewalls may have reduced surface roughness compared to, for instance, laser-drilled openings, which may also result in reduced transmission losses as, typically, high-frequency currents are conducted at the surface areas of the conductors, i.e., the contact elements. Hence, a smooth configuration of the sidewalls of the contact elements may reduce this "skin effect." Consequently, the electrical characteristics of the contact elements 437B may be well controlled on the basis of the shape of the contact elements 437B and/or the surface characteristics, as these contact elements represent an essential part of the feeding line of respective antenna structures still to be formed.

Thereafter, the sacrificial material 406 may be removed on the basis of known removal techniques, such as plasma ashing, wet chemical etching and the like.

Figure 4D:
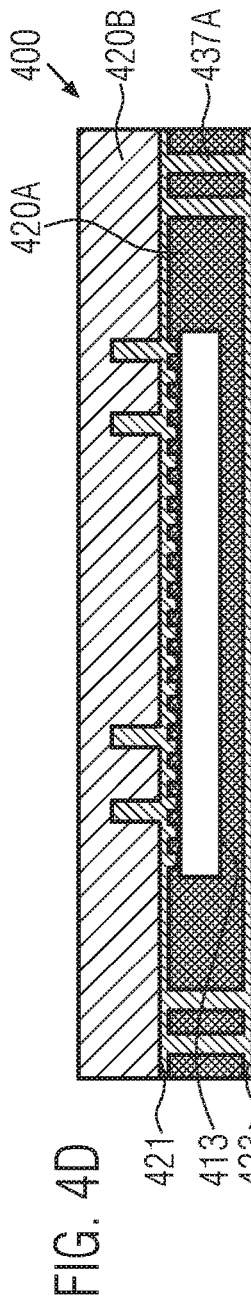

FIG. 4D schematically illustrates the semiconductor device 400 in a further advanced manufacturing stage, in which the second portion 420B may be provided, for instance, by a further molding process, wherein, also in this case, material characteristics, thickness and the like may be appropriately selected during the deposition process and/or during a subsequent planarization process, such as a grinding process and the like.

Figure 4E:
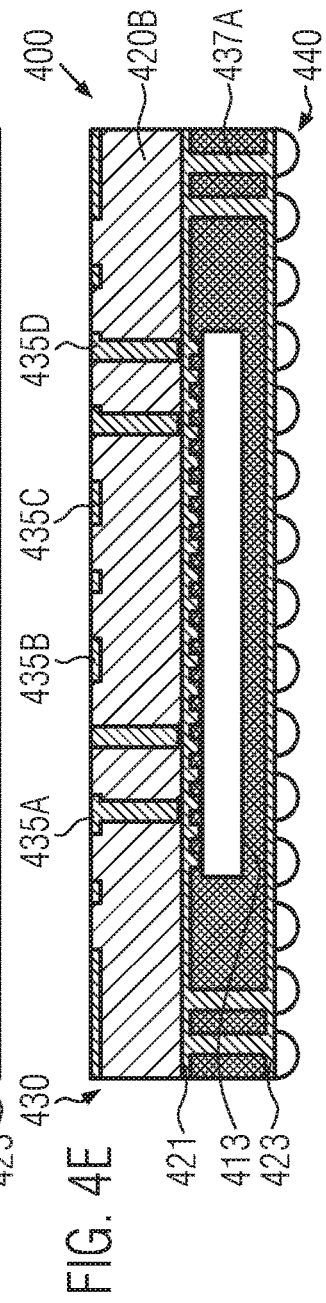

FIG. 4E schematically illustrates the semiconductor device 400 with the metallization structure 430 including the antenna structures 435A-435D and any other metal lines and the contact elements 437B providing electrical connection between the antenna structures 435A-435D and the first redistribution layer 421 and, thus, the semiconductor chip 410. Furthermore, the contact structure 440 is provided below the semiconductor chip 410 and is connected thereto by means of the second redistribution layer 423, the vias 437A and the first redistribution layer 421, as also previously discussed.

It should be appreciated that the process strategies as illustrated in FIGS. 3A-3D and 4A-4E have been described with reference to a "face up" configuration of the respective semiconductor chips. It is to be noted that the process techniques previously discussed may also be applied in the context of a "face down" configuration, which is shown, for instance, in FIG. 2A for the semiconductor device 200. In this case, the corresponding first and second redistribution layers have to be formed with appropriate configuration. Also in this case, at least a portion of the connection between the second redistribution layer 223 (FIG. 2A) and the corresponding antenna structures 235A-235D may be established on the basis of vias or contact elements formed on the basis of laser drilling or on the basis of highly controllable patterning strategies involving a lithography process and a respective anisotropic etch process.

As a result, the present disclosure provides manufacturing techniques and respective packaged semiconductor devices, wherein the packaging may be accomplished on wafer level on the basis of a package material which may be applied in a two-step process, thereby providing superior flexibility in adjusting overall material parameters. Moreover, the respective antenna structures may be placed above the semiconductor chip, thereby enabling an efficient packaging on wafer level and also ensuring very short electrical connections between the semiconductor chip and the antenna structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a first redistribution layer above a first surface of a semiconductor chip, said first redistribution layer comprising at least an antenna ground plate;
    forming a first dielectric material so as to enclose said semiconductor chip and mechanically connect said semiconductor chip to said first redistribution layer;
    forming a second redistribution layer so as to connect to a second surface of said semiconductor chip, said second surface being opposed to said first surface; and
    forming a metallization structure in a second dielectric material, said metallization structure including one or more antenna structures and a connection structure, said connection structure electrically connecting said one or more antenna structures to at least one of said first redistribution layer and said second redistribution layer, wherein forming said metallization structure comprises forming openings in said second dielectric material so as to connect to said first redistribution layer, and filling said openings with a conductive material.

2. The method of claim 1, wherein at least one of said one or more antenna structures is laterally positioned so as to be within an outline of said semiconductor chip when viewed along a height direction.

3. The method of claim 1, wherein forming said metallization structure comprises forming a first portion of said metallization structure prior to forming said second dielectric material and forming a second portion of said metallization structure after forming said second dielectric material.

4. The method of claim 3, wherein forming said first portion of said metallization structure comprises patterning a sacrificial material formed above said first redistribution layer and performing a deposition process in the presence of said patterned sacrificial layer so as to deposit a conductive material for forming contact elements in said connection structure.

5. The method of claim 4, wherein patterning said sacrificial material comprises performing a lithography process.

6. The method of claim 4, wherein forming said second portion of said metallization structure comprises forming said second dielectric material in the presence of said contact elements and forming at least said one or more antenna structures in said second dielectric material.

7. The method of claim 1, wherein at least some of said openings are formed by drilling.

8. The method of claim 1, wherein said first dielectric material is formed by a first molding process.

9. The method of claim 8, wherein said second dielectric material is formed by a second molding process that is independently performed with respect to said first molding process.

10. The method of claim 1, wherein said method is performed on an entire semiconductor wafer prior to separation into individual chips.

11. A radio frequency (RF) semiconductor device, comprising:
    a semiconductor chip configured to process RF signals, said semiconductor chip having a first surface and an opposed second surface;
    a dielectric package material enclosing said semiconductor chip;
    a first redistribution layer formed above said first surface of said semiconductor chip, said first redistribution layer comprising at least an antenna ground plate, said antenna ground plate being laterally positioned so as to be at least partially within an outline of said semiconductor chip when viewed along a height direction, wherein said first surface of said semiconductor chip includes contact pads electrically connected to said first redistribution layer;
    a second redistribution layer formed below said second surface of said semiconductor chip; and
    a metallization structure formed above said first surface and spaced apart from said first redistribution layer along said height direction and including one or more antenna structures, at least one of said one or more antenna structures being within said outline of said semiconductor chip when viewed along said height direction.

12. The RF semiconductor device of claim 11, further comprising contact elements extending between said first redistribution layer and said second redistribution layer, said contact elements electrically connecting said contact pads to a package contact structure for connecting to one of a substrate and a printed circuit board.

13. The RF semiconductor device of claim 11, wherein said second surface of said semiconductor chip includes contact pads electrically connected to said second redistribution layer.

14. The RF semiconductor device of claim 13, further comprising contact elements extending between said second redistribution layer and said one or more antenna structures for electrically connecting said one or more antenna structures with said semiconductor chip.

15. The RF semiconductor device of claim 11, wherein two or more antenna structures are provided and each of said two or more antenna structures are at least partially laterally positioned within said outline of said semiconductor chip when viewed along said height direction.

16. A radio frequency (RF) semiconductor device, comprising:
    a semiconductor chip including at least one RF component, said semiconductor chip having a first surface and an opposed second surface;
    a dielectric package material enclosing said semiconductor chip;
    a first redistribution layer formed above said first surface of said semiconductor chip, said first redistribution layer comprising at least an antenna ground plate, said antenna ground plate being laterally positioned so as to be at least partially within an outline of said semiconductor chip when viewed along a height direction;

a second redistribution layer formed below said second surface of said semiconductor chip; and a metallization structure formed above said first surface and said first redistribution layer along said height direction, said metallization structure including a plurality of antenna structures, each of said plurality of antenna structures being at least partially within said outline of said semiconductor chip when viewed along said height direction.

17. The RF semiconductor device of claim 16, wherein said first surface of said semiconductor chip includes contact pads electrically connected to said first redistribution layer, said semiconductor device further comprises contact elements extending between said first redistribution layer and said second redistribution layer, and wherein said contact elements electrically connect said contact pads to a package contact structure for connecting to one of a substrate and a printed circuit board.

* * * * *